United States Patent
Briant et al.

(10) Patent No.: US 9,210,817 B2
(45) Date of Patent: Dec. 8, 2015

(54) PLUGGABLE MODULE

(71) Applicant: Tyco Electronics Corporation, Berwyn, PA (US)

(72) Inventors: Eric David Briant, Dillsburg, PA (US); Troy Lyndon Blazek, Cottage Grove, MN (US)

(73) Assignee: Tyco Electronics Corporation, Berwyn, PA (US)

( * ) Notice: Subject to any disclaimer, the term of this patent is extended or adjusted under 35 U.S.C. 154(b) by 136 days.

(21) Appl. No.: 14/171,233

(22) Filed: Feb. 3, 2014

(65) Prior Publication Data

US 2015/0223349 A1  Aug. 6, 2015

(51) Int. Cl.
*H05K 1/14* (2006.01)
*H05K 5/00* (2006.01)

(52) U.S. Cl.
CPC .................... *H05K 5/0013* (2013.01)

(58) Field of Classification Search
None
See application file for complete search history.

(56) References Cited

U.S. PATENT DOCUMENTS

| | | | | |
|---|---|---|---|---|
| 4,641,217 | A * | 2/1987 | Morris et al. | 361/45 |
| 6,220,873 | B1 * | 4/2001 | Samela et al. | 439/76.1 |
| 6,299,362 | B1 * | 10/2001 | Gilliland et al. | 385/92 |
| 6,340,304 | B1 * | 1/2002 | Jones et al. | 439/138 |
| 6,386,919 | B2 * | 5/2002 | Medina et al. | 439/607.46 |
| 6,483,711 | B1 * | 11/2002 | Huang | 361/736 |
| 6,731,510 | B1 * | 5/2004 | Hwang et al. | 361/754 |
| 6,873,800 | B1 * | 3/2005 | Wei et al. | 398/138 |
| 6,890,206 | B2 * | 5/2005 | Distad et al. | 439/372 |
| 7,204,710 | B1 * | 4/2007 | Sato et al. | 439/326 |
| 7,325,983 | B1 * | 2/2008 | Dallesasse et al. | 385/92 |
| 8,057,260 | B2 * | 11/2011 | Zhu et al. | 439/607.41 |
| 2003/0072540 | A1 * | 4/2003 | Huang | 385/92 |
| 2003/0198445 | A1 * | 10/2003 | Inujima et al. | 385/92 |
| 2004/0105239 | A1 * | 6/2004 | Chiang | 361/728 |
| 2005/0245103 | A1 * | 11/2005 | Ellison | 439/61 |
| 2006/0030187 | A1 * | 2/2006 | Hsiao et al. | 439/160 |
| 2006/0121794 | A1 * | 6/2006 | Hanley et al. | 439/677 |
| 2007/0123090 | A1 * | 5/2007 | Kim et al. | 439/372 |
| 2007/0140626 | A1 * | 6/2007 | Chan | 385/89 |
| 2007/0140643 | A1 * | 6/2007 | Daikuhara et al. | 385/147 |
| 2009/0028557 | A1 * | 1/2009 | Togami et al. | 398/39 |

(Continued)

OTHER PUBLICATIONS

International Search Report, International Application No. PCT/2015/012169, International Filing Date, Jan. 21, 2015.

*Primary Examiner* — Hoa C Nguyen
*Assistant Examiner* — Xanthia C Cunningham (57) ABSTRACT

A pluggable module is provided for being pluggably received within a receptacle assembly. The pluggable module includes a circuit board configured to be terminated to a cable, and a housing extending a length from a plug end to a cable end. The housing includes complementary first and second shells that are mated together along a mating axis such that the first and second shells define an interior chamber of the housing. The circuit board is held within the interior chamber such that the circuit board is exposed at the plug end. The first and second shells includes respective first and second openings that extend into the respective first and second shells along respective first and second central axes that each extend non-parallel to the mating axis. The first and second openings are at least partially aligned. A spring pin extends within the first and second openings to hold the first and second shells together. A first segment of the spring pin extends within the first opening of the first shell and a second segment of the spring pin extends within the second opening of the second shell.

16 Claims, 4 Drawing Sheets

(56) References Cited

U.S. PATENT DOCUMENTS

| | | | |
|---|---|---|---|
| 2009/0092399 A1* | 4/2009 | Moore et al. | 398/135 |
| 2009/0209125 A1* | 8/2009 | Bright et al. | 439/352 |
| 2009/0269943 A1* | 10/2009 | Palli et al. | 439/39 |
| 2009/0321301 A1* | 12/2009 | Song et al. | 206/701 |
| 2010/0112861 A1* | 5/2010 | Sasser et al. | 439/607.19 |
| 2012/0039572 A1* | 2/2012 | Amirkiai et al. | 385/88 |
| 2012/0218720 A1* | 8/2012 | Wu | 361/740 |
| 2013/0012052 A1* | 1/2013 | Lee | 439/345 |
| 2013/0337671 A1* | 12/2013 | Tsang et al. | 439/159 |
| 2014/0079403 A1* | 3/2014 | Daghighian et al. | 398/115 |

* cited by examiner

PLUGGABLE MODULE

BACKGROUND OF THE INVENTION

The subject matter described and/or illustrated herein relates generally to pluggable modules, and more particularly, to pluggable modules that are pluggably received within receptacle assemblies.

Various types of fiber optic and copper based transceiver assemblies that permit communication between host equipment and external devices are known. These transceiver assemblies typically include a pluggable module that defines a modular plug that is inserted into, and thus pluggably received by, a receptacle assembly of the transceiver assembly. Such pluggable modules may also be referred to as transceivers or interconnects. The pluggable modules are constructed according to various standards for size and compatibility, such as the Quad Small Form-factor Pluggable (QSFP) module standard and the XFP standard.

A typical pluggable module includes a housing composed of complementary shells that mate together to define an interior chamber of the pluggable module. A circuit board is held within the interior chamber. The circuit board includes a card edge that is exposed at a plug end of the housing for mating with a receptacle connector of the receptacle assembly. But, the shells of at least some known pluggable modules are held together using screws or rivets. The use of screws or rivets to hold the shells of the pluggable module housing together complicate the process of assembling the pluggable module, which thereby increases the cost and/or time required to assemble the pluggable module. Moreover, the screws and rivets of known pluggable modules are placed in tension when the shells are connected together, which may provide the connection between the shells with less strength.

BRIEF DESCRIPTION OF THE INVENTION

In an embodiment, a pluggable module is provided for being pluggably received within a receptacle assembly. The pluggable module includes a circuit board configured to be terminated to a cable, and a housing extending a length from a plug end to a cable end. The housing includes complementary first and second shells that are mated together along a mating axis such that the first and second shells define an interior chamber of the housing. The circuit board is held within the interior chamber such that the circuit board is exposed at the plug end. The first and second shells includes respective first and second openings that extend into the respective first and second shells along respective first and second central axes that each extend non-parallel to the mating axis. The first and second openings are at least partially aligned. A spring pin extends within the first and second openings to hold the first and second shells together. A first segment of the spring pin extends within the first opening of the first shell and a second segment of the spring pin extends within the second opening of the second shell.

In an embodiment, a pluggable module is provided for being pluggably received within a receptacle assembly. The pluggable module includes a circuit board configured to be terminated to a cable, and a housing extending a length from a plug end to a cable end. The housing includes complementary first and second shells that are mated together along a mating axis such that the first and second shells define an interior chamber of the housing. The circuit board is held within the interior chamber such that the circuit board is exposed at the plug end. The first and second shells include respective first and second openings that extend into the respective first and second shells along respective first and second central axes that each extend one of oblique or approximately perpendicular to the mating axis. The first and second openings are at least partially aligned. A spring pin extends within the first and second openings to hold the first and second shells together. A first segment of the spring pin extends within the first opening of the first shell and a second segment of the spring pin extends within the second opening of the second shell.

In an embodiment, a pluggable module is provided for being pluggably received within a receptacle assembly. The pluggable module includes a circuit board configured to be terminated to a cable, and a housing extending a length from a plug end to a cable end. The housing includes complementary first and second shells that are mated together such that the first and second shells define an interior chamber of the housing. The circuit board is held within the interior chamber such that the circuit board is exposed at the plug end. The first and second shells include respective first and second openings that are at least partially aligned. A spring pin extends within the first and second openings to hold the first and second shells together. A first segment of the spring pin extends within the first opening of the first shell and a second segment of the spring pin extends within the second opening of the second shell.

DETAILED DESCRIPTION OF THE INVENTION

Figure 1:
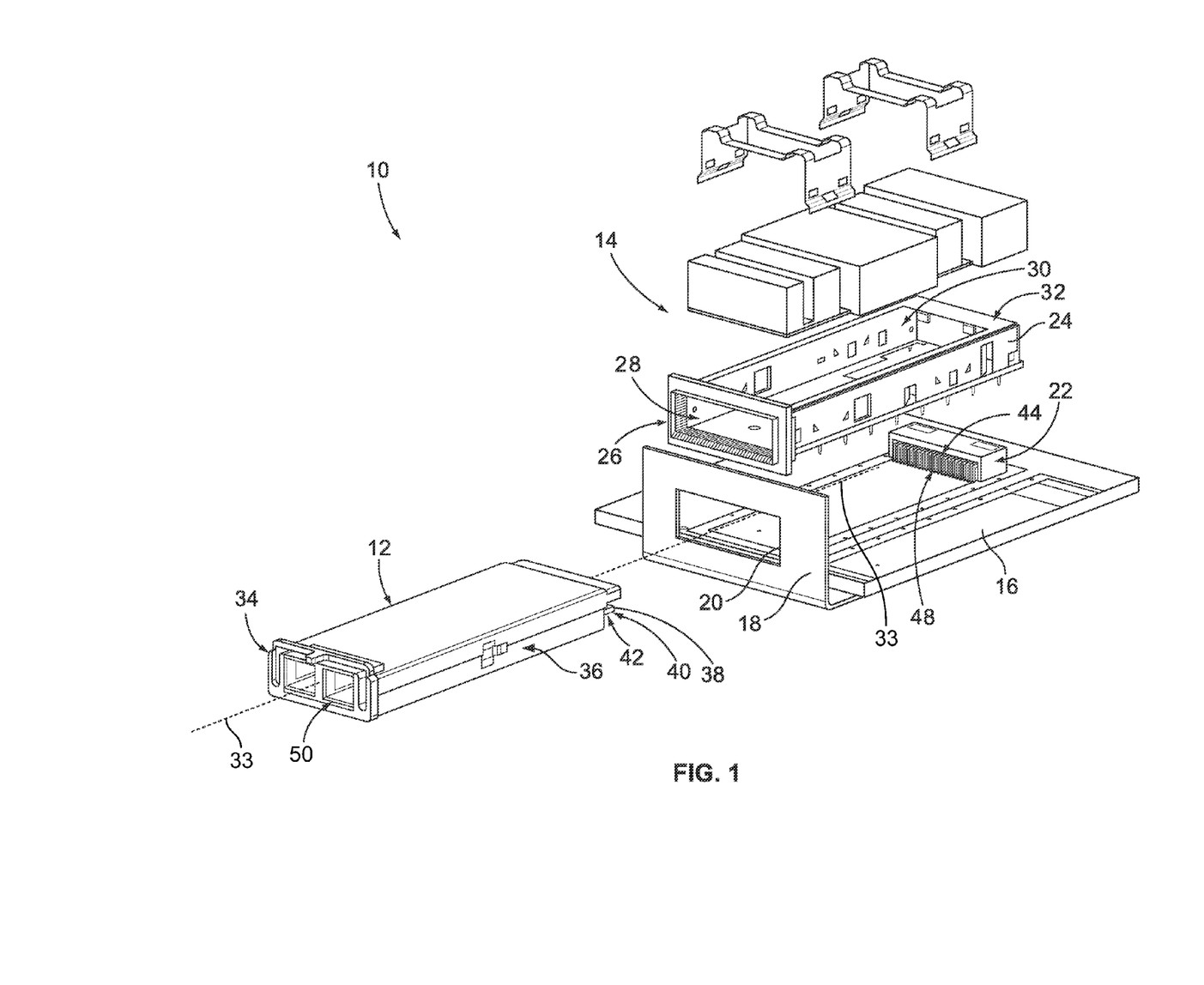
FIG. 1 is an exploded perspective view of an embodiment of a transceiver assembly.

FIG. 1 is an exploded perspective view of an exemplary embodiment of a transceiver assembly 10. In some embodiments, the transceiver assembly 10 is adapted to address, among other things, conveying data signals at high rates, such as data transmission rates of at least 10 gigabits per second (Gbps), which is required by the SFP+ standard. For example, in some embodiments the transceiver assembly 10 is adapted to convey data signals at a data transmission rate of at least 28 Gbps. Moreover, and for example, in some embodiments the transceiver assembly 10 is adapted to convey data signals at a data transmission rate of between approximately 20 Gbps and approximately 30 Gbps. It is appreciated, however, that the benefits and advantages of the subject matter described and/or illustrated herein may accrue equally to other data transmission rates and across a variety of systems and standards. In other words, the subject matter described and/or illustrated herein is not limited to data transmission rates of 10 Gbps or greater, any standard, nor the exemplary type of transceiver assembly shown and described herein.

The transceiver assembly 10 includes a pluggable module 12 configured for pluggable insertion into a receptacle assembly 14 that is mounted on a host circuit board 16. The host circuit board 16 may be mounted in a host system (not shown) such as, but not limited to, a router, a server, a computer, and/or the like. The host system typically includes a conductive chassis having a bezel 18 including an opening 20 extending therethrough in substantial alignment with the receptacle assembly 14. The receptacle assembly 14 is optionally electrically connected to the bezel 18.

In general, the pluggable module 12 and the receptacle assembly 14 may be used in any application requiring an interface between a host system and electrical and/or optical signals. The pluggable module 12 interfaces to the host system through the receptacle assembly 14 via a receptacle connector 22 of the receptacle assembly 14. The receptacle connector 22 is located within a receptacle guide frame 24 of the receptacle assembly 14. The receptacle guide frame 24 may also referred to as a "cage". The guide frame 24 includes a front end 26 having a front opening 28 that is open to an interior space 30 (i.e., a cavity) of the guide frame 24. The receptacle connector 22 is positioned within the interior space 30 at a rear 32 of the guide frame 24. The interior space 30 of the guide frame 24 is configured to receive the pluggable module 12 therein in electrical connection with the receptacle connector 22.

The pluggable module 12 is configured to be inserted into the receptacle assembly 14 along an insertion axis 33 such that a cable end 34 of the pluggable module 12 extends outwardly from, or is at least exposed at, the front end 26 of the receptacle assembly 14. The pluggable module 12 is inserted into the receptacle assembly through the bezel opening 20. The pluggable module 12 includes a housing 36 that forms a protective shell for a circuit board 38 that is disposed within the housing 36. The circuit board 38 carries circuitry, traces, paths, devices, and/or the like that perform transceiver functions in a known manner. A card edge 40 of the circuit board 38 is exposed at a plug end 42 of the housing 36. In the illustrated embodiment, the circuit board 38 of the pluggable module 12 directly mates with the receptacle connector 22 of the receptacle assembly 14. Specifically, the card edge 40 of the circuit board 38 is received within a receptacle 44 of the receptacle connector 22 such that contact pads 46 (FIG. 2) of the card edge 40 mate with electrical contacts 48 of the receptacle connector 22 to electrically connect the pluggable module 12 to the receptacle connector 22. Alternatively, a connector (not shown; e.g., a straddle mount connector and/or the like) is mounted to the circuit board 38 and exposed at the plug end 42 of the housing 36 for plugging into the receptacle 44 of the receptacle connector 22.

The circuit board 38 of the pluggable module 12 is configured to be terminated to a cable (not shown) for electrically and/or optically connecting an external device (not shown) to the host system. The cable may be an electrical cable that conducts electrical signals and/or ground, and/or the cable may be an optical cable that transmits optical signals. Optionally, the pluggable module 12 is terminated to the cable through a connector interface 50 at the cable end 34 of the housing 36. Alternatively, the cable is terminated directly to the circuit board 38. Suitable connector interfaces 50 are known and include adapters for the LC style fiber connectors and the MTP/MPO style fiber connectors offered by Tyco Electronics Corporation (Harrisburg, Pa.).

Figure 2:
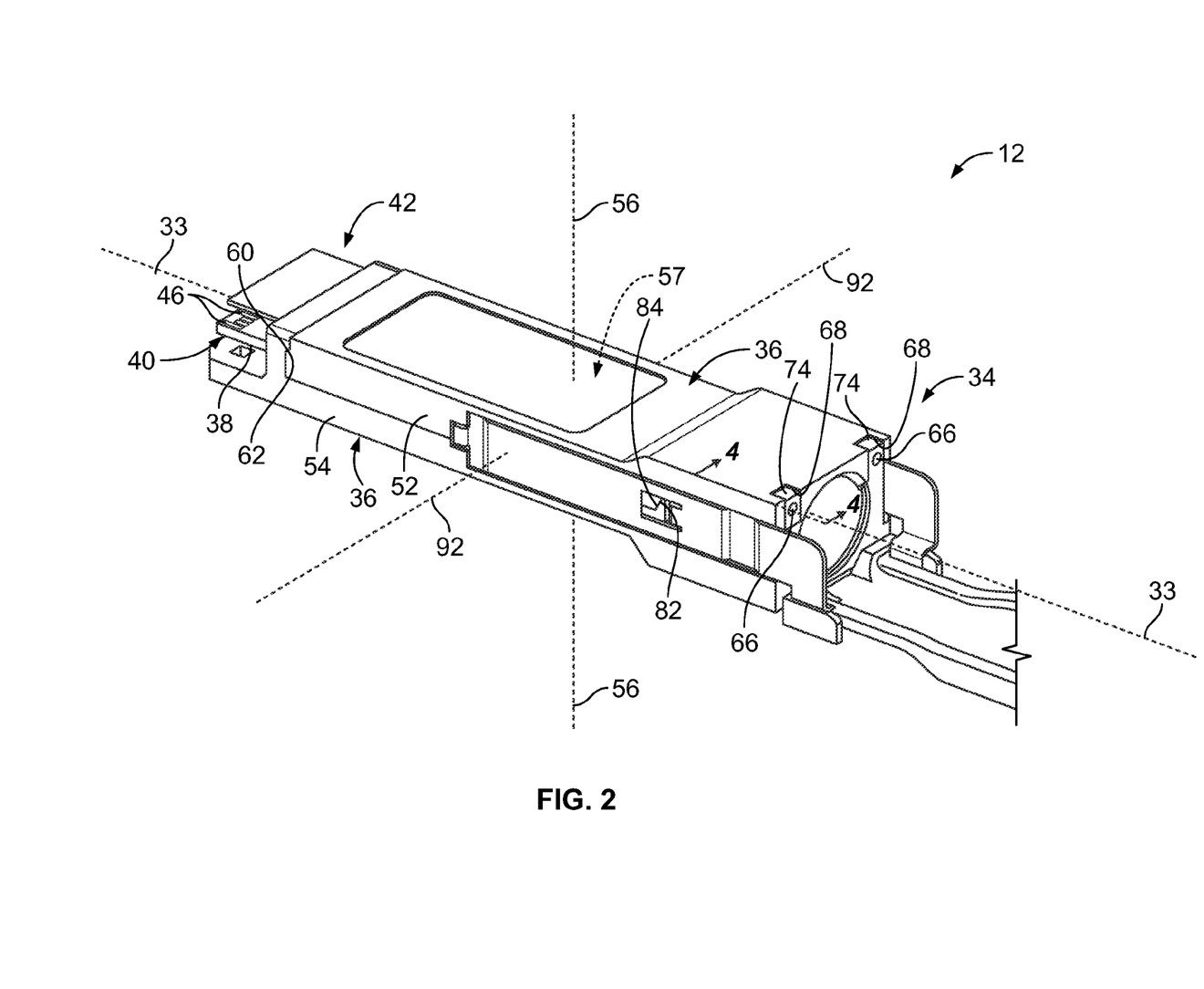
FIG. 2 is a perspective view of an embodiment of a pluggable module of the transceiver assembly shown in FIG. 1.

FIG. 2 is a perspective view of an embodiment of the pluggable module 12. The pluggable module 12 includes the housing 36, which extends a length along the insertion axis 33 from the cable end 34 to the plug end 42. The housing 36 includes complementary shells 52 and 54 that are mated together along a mating axis 56 to define the housing 36. As can be seen in FIG. 2, the insertion axis 33 extends approximately perpendicular to the mating axis 56. The shells 52 are mated together such that the shells define an interior chamber 57 of the housing 36. As shown in FIG. 2, the circuit board 38 is held within the interior chamber 57 of the housing 36 such that the card edge 40 of the circuit board 38 is exposed at the plug end 42 of the housing 36. The contact pads 46 of the circuit board 38 are thus exposed at the plug end 42 of the housing 36 for mating with the electrical contacts 48 (FIG. 1) of the receptacle connector 22 (FIG. 1). Each of the shells 52 and 54 may be referred to herein as a "first" and/or a "second" shell.

As will be described in more detail below, the shells 52 and 54 of the housing 36 are held together using one or more spring pins 58 (FIGS. 3 and 4) and complementary interlocking members 60 and 62 that prevent the shells 52 and 54 from separating from each other. For example, the spring pins 58 and/or the interlocking members 60 and 62 prevent the shells 52 and 54 from separating from each other along the mating axis 56.

Figure 3:
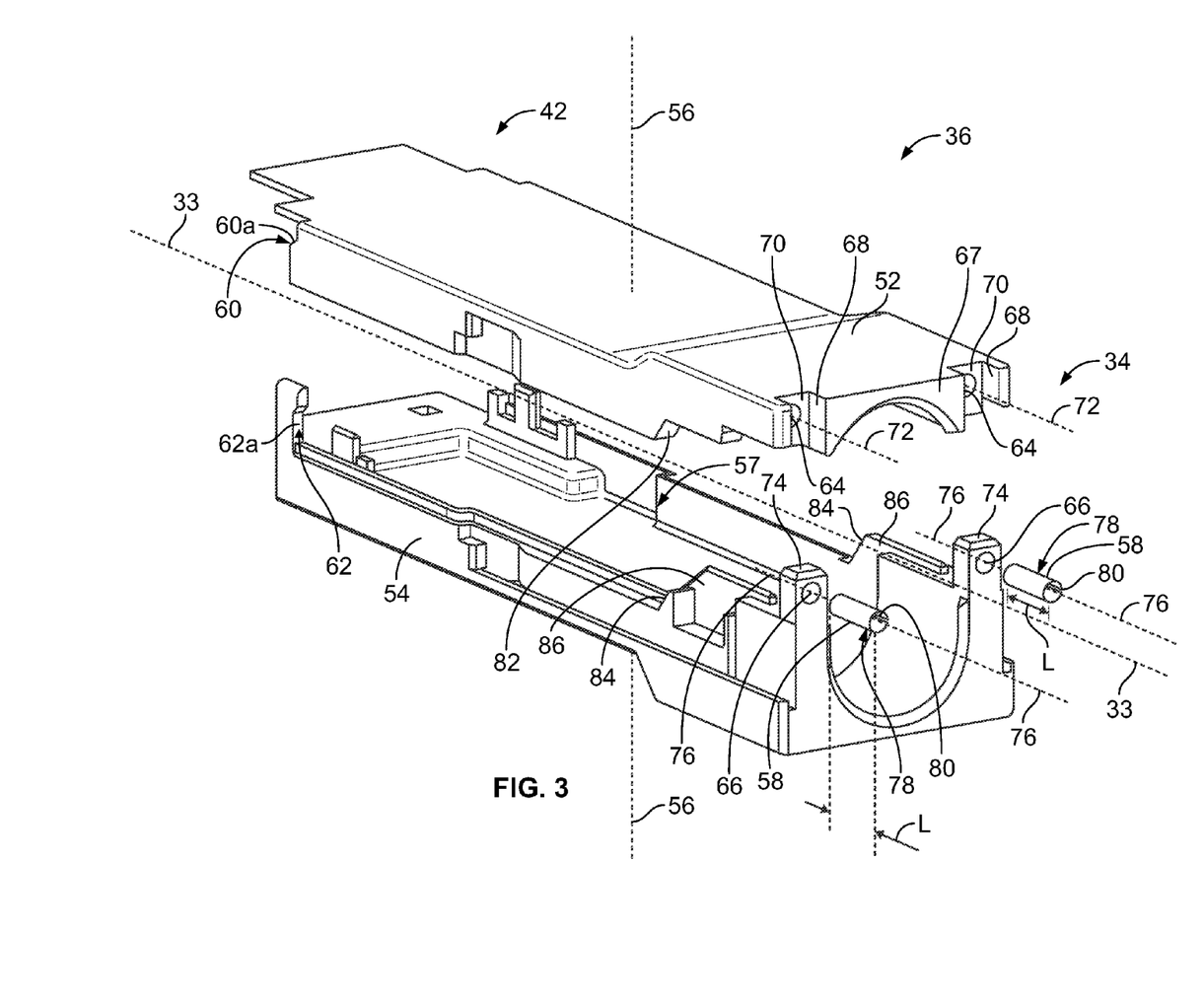
FIG. 3 is an exploded perspective view of an embodiment of a housing of the pluggable module shown in FIG. 2.

FIG. 3 is an exploded perspective view of an embodiment of the housing 36 of the pluggable module 12. Each of the shells 52 and 54 includes one or more openings 64 and 66, respectively, for holding the spring pins 58. In the illustrated embodiment, the openings 64 and 66 extend into the respective shells 52 and 54 at the cable end 34 of the housing 36. But, in addition or alternatively to any openings 64 and/or 66 that extend into the respective shell 52 and 54 at the cable end 34, each of the openings 64 and 66 may extend into the respective shell 52 and 54 at any other location along the respective shell 52 and 54, such as, but not limited to, at the plug end 42 of the housing 36 and/or the like. Each of the openings 64 may be referred to herein as a "first" and/or a "second" opening. Each of the openings 66 may be referred to herein as a "first" and/or a "second" opening.

In the illustrated embodiment, the shell 52 includes two openings 64 for holding two spring pins 58. But, the shell 52 may include any number of the openings 64 for holding any number of spring pins 58. The shell 52 includes one or more optional recesses 68. Specifically, the cable end 34 of the shell 52 includes a wall 67 into which each recess 68 extends. Each recess 68 includes one or more of the openings 64. Specifically, the openings 64 extend into the shell 52 through a bottom wall 70 of a corresponding recess 68 such that the openings 64 are open to the corresponding recess 68. Each opening 64 extends into the shell 52 along a central axis 72. As can be seen in FIG. 3, the central axes 72 each extend non-parallel to the mating axis 56. In the illustrated embodiment, each central axis 72 extends approximately perpendicular to the mating axis 56. But, each central axis 72 may extend at any other non-parallel angle (i.e., an oblique angle) relative to the mating axis 56. As can also be seen in FIG. 3, each of the central axes 72 extends approximately parallel to the insertion axis 33 in the illustrated embodiment. But, each central axis 72 may extend at a perpendicular or oblique angle relative to the insertion axis 33 so long as the central axis 72 does not extend parallel to the mating axis 56. Each of the central axes 72 may be referred to herein as a "first" and/or a "second" central axis.

Optionally, the shell 54 includes one or more tabs 74. Each tab 74 includes one or more of the openings 66. Specifically, each of the openings 66 extends through a corresponding tab 74. The openings 66 extend into the shell 54 along central axes 76. Each of the central axes 76 extends non-parallel to the mating axis 56, as shown in FIG. 3. In the illustrated embodiment, each central axis 76 extends approximately perpendicular to the mating axis 56, but each central axis 76 may extend at any other non-parallel angle (i.e., an oblique angle) relative to the mating axis 56. Each of the central axes 76 extends approximately parallel to the insertion axis 33 in the illustrated embodiment, but each central axis 76 may extend at a perpendicular or oblique angle relative to the insertion axis 33 so long as the central axis 76 does not extend parallel to the mating axis 56. Each of the central axes 76 may be referred to herein as a "first" and/or a "second" central axis.

Each recess 68 of the shell 52 is configured to receive a corresponding tab 74 of the shell 54 when the shells 52 and 54 are mated together. Reception of the tabs 74 within the recesses 68 at least partially aligns each of the openings 64 of the shell 52 with a corresponding opening 66 of the shell 54 such that corresponding openings 64 and 66 can receive a single spring pin 58 therein.

As can be seen in FIG. 3, each spring pin 58 includes a body 78 having a slot 80 that extends along a length L of the body 78. The slot 80 enables the body 78 to partially collapse radially inward. The body 78 defines a spring that exerts a radially outward acting spring force when the body 78 has been collapsed radially inward from the natural resting position of the body 78 that is shown in FIG. 3. In the illustrated embodiment, the body 78 of each spring pin 58 includes a cylindrical shape (i.e., a circular cross-sectional shape). But, additionally or alternatively the body 78 of each spring pin 58 may include any other shape, such as, but not limited to, a parallelepiped shape (i.e., a rectangular cross-sectional shape), a triangular cross-sectional shape, an oval cross-sectional shape, a cross-sectional shape that includes at least five sides, and/or the like. Although two are provided in the illustrated embodiment, the pluggable module 12 may include any number of spring pins 58 for holding the shells 52 and 54 together.

The shell 52 includes one or more of the interlocking members 60, and the shell 54 includes one or more of the interlocking member 62. Each interlocking member 60 has a complementary shape with a corresponding interlocking member 62 such that corresponding interlocking members 60 and 62 are configured to interlock to facilitate holding the shells 52 and 54 together. Although only one interlocking member 60 and only one interlocking member 62 are visible, in the illustrated embodiment, the shell 52 includes two interlocking members 60 and the shell 54 includes two interlocking members 62. But, the shell 52 may include any number of interlocking members 60 and the shell 54 may include any number of the interlocking members 62.

In the illustrated embodiment, each interlocking member 62 of the shell 54 includes a relief 62a that receives a projection 60a of the corresponding interlocking member 60 therein to interlock the corresponding interlocking members 60 and 62. But, additionally or alternatively the interlocking members 60 and/or 62 may have other shapes, configurations, and/or the like. For example, although shown with angular ramped structures, the interlocking members 60 and/or 62 may additionally or alternatively include curved structures. Moreover, in some embodiments, an interlocking member 60 of the shell 52 includes a relief that receives a projection of the corresponding interlocking member 62 of the shell 54 therein.

The shell 52 optionally includes one or more ramp members 82 that cooperate with corresponding optional ramp member(s) 84 of the shell 54 to facilitate holding the shells 52 and 54 together. Each ramp member 82 has a complementary shape with the corresponding ramp member 84 such that corresponding ramp members 82 and 84 engage in physical contact with each other to facilitate holding the shells 52 and 54 together. In the illustrated embodiment, the shell 52 includes two ramp members 82 (only one is visible) and the shell 54 includes two ramp members 84. But, the shell 52 may include any number of ramp members 82 and the shell 54 may include any number of ramp members 84. Although the ramp members 82 and 84 are shown with angular ramped structures, the ramp members 82 and 84 may additionally or alternatively include curved structures. As can be seen in FIG. 3, the shell 54 optionally includes shoulders 86 that extend adjacent the ramp members 84.

Referring again to FIG. 2, the shells 52 and 54 of the housing 36 have been mated together along the mating axis 56. The tabs 74 of the shell 54 are received within the corresponding recesses 68 of the shell 52 such that each opening 64 (FIGS. 3 and 4) of the shell 52 is at least partially aligned with the corresponding opening 66 of the shell 54. Each pair of corresponding openings 64 and 66 has a spring pin 58 (FIGS. 3 and 4) received therein, as will be described below.

Figure 4:
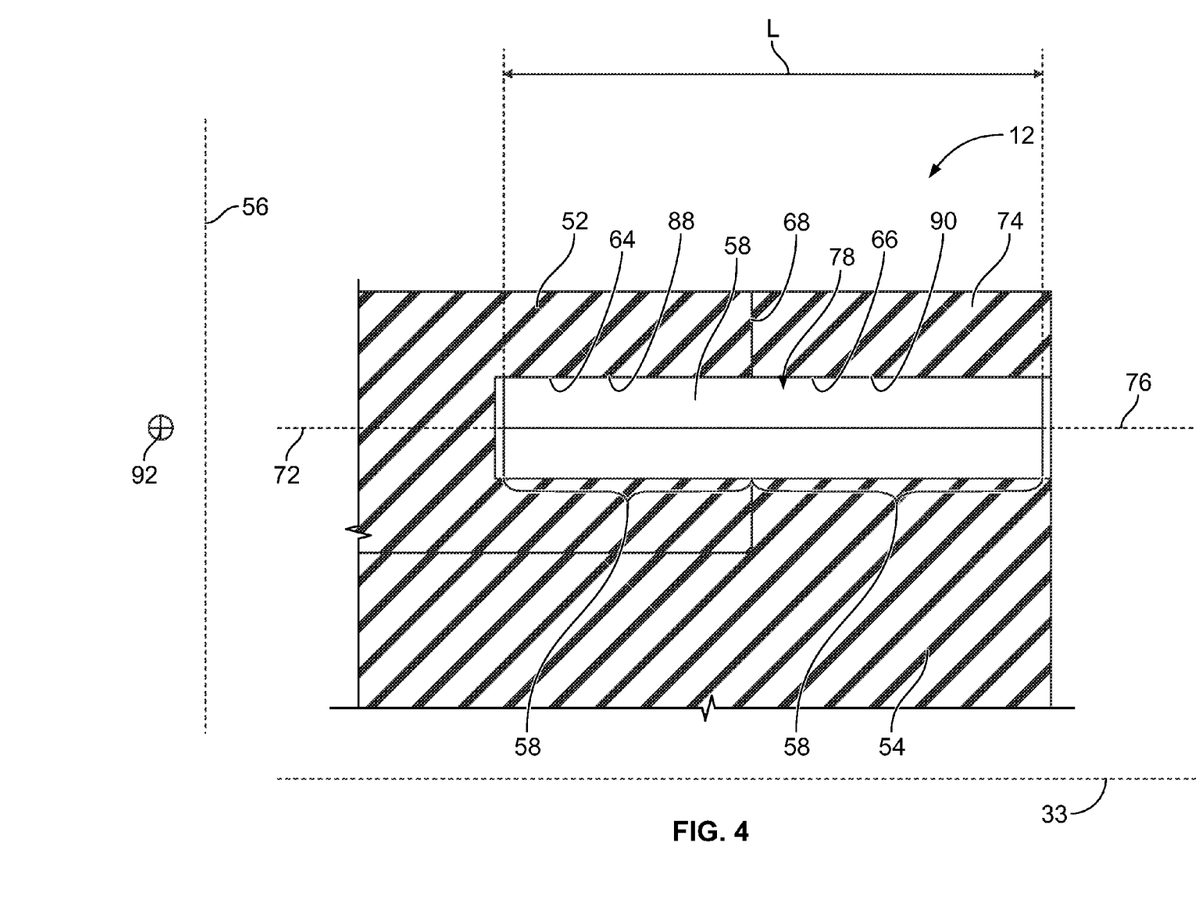
FIG. 4 is a cross-sectional view of a portion of the pluggable module shown in FIG. 2 taken along line 4-4 of FIG. 2.

FIG. 4 is a cross-sectional view of a portion of the pluggable module 12 taken along line 4-4 of FIG. 2. FIG. 4 illustrates a pair of corresponding openings 64 and 66 with a spring pin 58 received therein. In the illustrated embodiment, the tab 74 of the shell 54 is received within the corresponding recess 68 of the shell 52 such that the central axes 72 and 76 of the respective openings 64 and 66 are aligned with each other, as can be seen in FIG. 4. In some other embodiments, the central axis 76 of the opening 66 is slightly offset from the central axis 72 of the corresponding opening 64 to facilitate holding the shells 52 and 54 together as tightly as possible with as small of a, or no, gap between the shells 52 and 54, which may facilitate electromagnetic interference (EMI) shielding.

As shown in FIG. 4, a spring pin 58 extends within the openings 64 and 66. Specifically, a segment 58a of the length L of the spring pin 58 extends within the opening 64 of the shell 52, and a segment 58b of the length L of the spring pin 58 extends within the opening 66 of the shell 54. The spring pin 58 has an interference fit within the openings 64 and 66. Specifically, the body 78 of the spring pin 58 has been partially collapsed radially (relative to the axes 72 and 76) inward such that the body 78 exerts a radially (relative to the axes 72 and 76) outward acting spring force against interior surfaces 88 and 90 of the shells 52 and 54, respectively, that define the openings 64 and 66, respectively. Each of the segments 58a and 58b of the spring pin 58 may be referred to herein as a "first" and/or a "second" segment.

The spring pin 58 facilitates holding the shells 52 and 54 as mated together. In other words, the spring pin 58 prevents the shells 52 and 54 from separating from each other. For example, the spring pin 58 prevents the shells 52 and 54 from separating from each other along the mating axis 56. The spring pin 58 may also prevent the shells 52 and 54 from separating from each other along the insertion axis 33 and/or along an axis 92 that extends approximately perpendicular to both the mating axis 56 and the insertion axis 33. Each of the axis 92 and the insertion axis 33 may be referred to herein as "another" axis.

As shown in FIG. 4, the spring pin 58 connects the shells 52 and 54 together in shear. In other words, a separating force applied to the shells 52 and 54 along the mating axis 56 will exert a shear force on the spring pin 58. In the illustrated embodiment, the spring pin 58 connects the shells 52 and 54 together in shear because the length L of the spring pin 58 extends approximately perpendicular to the mating axis 56. But, it should be understood that the length L of the spring pin 58 may extend at any non-parallel angle relative to the mating axis 56 that exerts at least some level of shear force on the spring pin 58 when a separating force is applied to the shells 52 and 54 along the mating axis 56.

As is also shown in FIG. 4, the length L of the spring pin 58 extends approximately perpendicular to the axis 92 in the illustrated embodiment. Accordingly, in the illustrated embodiment, a separating force applied to the shells 52 and 54 along the axis 92 will exert a shear force on the spring pin 58. In some other embodiments, the length L of the spring pin 58 extends approximately parallel to the axis 92 such that a separating force is applied to the shells 52 and 54 along the axis 92 does not exert more than a de minimis shear force on the spring pin 58.

By connecting the shells 52 and 54 together in shear, the spring pin 58 may provide a mated connection between the shells 52 and 54 with greater strength, for example as compared to a connecting structure that connects the shells 52 and 54 together in tension.

Referring again to FIG. 2, the interlocking members 60 of the shell 52 are interlocked with the corresponding interlocking members 62 of the shell 54 to facilitate holding the shells 52 and 54 together. The interlocked connection between the interlocking members 60 and 62 prevents the shells 52 and 54 from separating from each other along the insertion axis 33 and along the mating axis 56.

As shown in FIG. 2, the ramp members 82 of the shell 52 are engaged in physical contact with the corresponding ramp members 84 of the shell 54 to facilitate holding the shells 52 and 54 together. The physical engagement between the ramp members 82 and 84 prevents the shells 52 and 54 from separating from each other along the insertion axis 33. For example, the physical engagement between the ramp members 82 and 84 may force the shell 52 toward the plug end 42 along the insertion axis 33 such that the fit between the interlocking members 60 and 62 is relatively tight. Additionally, the physical engagement between the ramp members 82 and 84 may provide the vertical segments of the interlocking members 62 as datums that align the shells 52 and 54 with respect to each other to facilitate eliminating or reducing play (i.e., relative movement between) within the fit of the shells 52 and 54. Moreover, the shoulders 86 (FIG. 3) of the shell 54 prevent the shells 52 and 54 from separating from each other along the axis 92.

The embodiments described and/or illustrated herein may provide a pluggable module that is less complicated, less costly, and/or requires less time to assemble as compared to at least some known pluggable modules. The embodiments described and/or illustrated herein may provide a pluggable module having housing shells that are connected together with a stronger connection as compared to pluggable modules that use screws and/or rivets to connect the housing shells together. The embodiments described and/or illustrated herein may provide a pluggable module having housing shells that are connected together with a stronger connection as compared to pluggable modules having housing shells that are connected together by a connecting structure in tension.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the subject matter described and/or illustrated herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A pluggable module for being pluggably received within a receptacle assembly, the pluggable module comprising:
   a circuit board configured to be terminated to a cable;
   a housing extending a length from a plug end to a cable end, the housing comprising complementary first and second shells that are mated together along a mating axis such that the first and second shells define an interior chamber of the housing, the circuit board being held within the interior chamber such that the circuit board is exposed at the plug end, wherein the first and second shells comprise respective first and second openings that extend into the respective first and second shells along respective first and second central axes that each extend non-parallel to the mating axis, the first and second openings being at least partially aligned; and
   a spring pin extending within the first and second openings to hold the first and second shells together, wherein a first segment of the spring pin extends within the first opening of the first shell and a second segment of the spring pin extends within the second opening of the second shell;
   wherein the pluggable module is configured to be received within the receptacle assembly along an insertion axis that extends approximately perpendicular to the mating axis, the first and second central axes of the respective first and second openings extending approximately parallel to the insertion axis.

2. The pluggable module of claim 1, wherein the first and second central axes of the respective first and second openings extend approximately perpendicular to the mating axis.

3. The pluggable module of claim 1, wherein the first and second central axes of the respective first and second openings extend approximately perpendicular to the mating axis or oblique to the mating axis.

4. The pluggable module of claim 1, wherein the spring pin has an interference fit within the first and second openings.

5. The pluggable module of claim 1, wherein the spring pin prevents the first and second shells from separating from each other at least one of along the mating axis or along another axis that extends approximately perpendicular to the mating axis.

6. The pluggable module of claim 1, wherein the first and second openings extend through the respective first and second shells at the cable end of the housing.

7. The pluggable module of claim 1, wherein the first shell comprises a recess that includes the first opening and the second shell comprises a tab that includes the second opening, the tab being received within the recess such that the first and second openings are at least partially aligned.

8. The pluggable module of claim 1, wherein the first and second shells comprise respective first and second interlock members that interlock with each other for holding the first and second shells together.

9. The pluggable module of claim 1, wherein the spring pin connects the first and second shells together in shear.

10. The pluggable module of claim 1, wherein the first and second central axes of the respective first and second openings are aligned with each other.

11. A pluggable module for being pluggably received within a receptacle assembly, the pluggable module comprising:
a circuit board configured to be terminated to a cable;
a housing extending a length from a plug end to a cable end, the housing comprising complementary first and second shells that are mated together along a mating axis such that the first and second shells define an interior chamber of the housing, the circuit board being held within the interior chamber such that the circuit board is exposed at the plug end, wherein the first and second shells comprise respective first and second openings that extend into the respective first and second shells along respective first and second central axes that each extend one of oblique or approximately perpendicular to the mating axis, the first and second openings being at least partially aligned; and
a spring pin extending within the first and second openings to hold the first and second shells together, wherein a first segment of the spring pin extends within the first opening of the first shell and a second segment of the spring pin extends within the second opening of the second shell;
wherein the pluggable module is configured to be received within the receptacle assembly along an insertion axis that extends approximately perpendicular to the mating axis, the first and second central axes of the respective first and second openings extending approximately parallel to the insertion axis.

12. The pluggable module of claim 11, wherein the spring pin has an interference fit within the first and second openings.

13. The pluggable module of claim 11, wherein the spring pin prevents the first and second shells from separating from each other at least one of along the mating axis or along another axis that extends approximately perpendicular to the mating axis.

14. The pluggable module of claim 11, wherein the first shell comprises a recess that includes the first opening and the second shell comprises a tab that includes the second opening, the tab being received within the recess such that the first and second openings are at least partially aligned.

15. The pluggable module of claim 11, wherein the first and second central axes of the respective first and second openings are aligned with each other.

16. A pluggable module for being pluggably received within a receptacle assembly, the pluggable module comprising:
a circuit board configured to be terminated to a cable;
a housing extending a length from a plug end to a cable end, the housing comprising complementary first and second shells that are mated together such that the first and second shells define an interior chamber of the housing, the circuit board being held within the interior chamber such that the circuit board is exposed at the plug end, wherein the first and second shells comprise respective first and second openings that are at least partially aligned; and
a spring pin extending within the first and second openings to hold the first and second shells together, wherein a first segment of the spring pin extends within the first opening of the first shell and a second segment of the spring pin extends within the second opening of the second shell;
wherein the pluggable module is configured to be received within the receptacle assembly along an insertion axis, and wherein the first and second openings have respective first and second central axes extending approximately parallel to the insertion axis.

* * * * *